(12) United States Patent
Iwamoto et al.

(10) Patent No.: US 7,541,293 B2
(45) Date of Patent: Jun. 2, 2009

(54) METHOD FOR MANUFACTURING SEMICONDUCTOR DEVICE

(75) Inventors: Hayato Iwamoto, Kanagawa (JP); Kei Kinoshita, Kanagawa (JP)

(73) Assignees: Sony Corporation, Tokyo (JP); SEZ Japan, Inc., Tokyo (JP)

( * ) Notice: Subject to any disclaimer, the term of this patent is extended or adjusted under 35 U.S.C. 154(b) by 995 days.

(21) Appl. No.: 10/168,444

(22) PCT Filed: Oct. 25, 2001

(86) PCT No.: PCT/JP01/09408

§ 371 (c)(1),
(2), (4) Date: Oct. 7, 2002

(87) PCT Pub. No.: WO02/35594

PCT Pub. Date: May 2, 2002

(65) Prior Publication Data

US 2003/0109137 A1    Jun. 12, 2003

(51) Int. Cl.
*H01L 21/302* (2006.01)
(52) U.S. Cl. .......... 438/745; 438/748; 438/749; 438/750; 438/756
(58) Field of Classification Search .......... 438/689, 438/745, 756, 748, 749, 750
See application file for complete search history.

(56) References Cited

U.S. PATENT DOCUMENTS 5,997,653 A * 12/1999 Yamasaka .......... 134/2
6,096,233 A * 8/2000 Taniyama et al. .......... 216/92
6,140,233 A * 10/2000 Kwag et al. .......... 438/669
6,232,228 B1 * 5/2001 Kwag et al. .......... 438/669
6,322,626 B1 * 11/2001 Shirley .......... 118/73
6,333,275 B1 * 12/2001 Mayer et al. .......... 438/745
6,342,434 B1 * 1/2002 Miyamoto et al. .......... 438/464
6,358,765 B2 * 3/2002 Tanaka .......... 438/29
6,730,579 B1 * 5/2004 Sasaka .......... 438/464
2001/0054706 A1 * 12/2001 Levert et al. .......... 252/79.1
2002/0063169 A1 * 5/2002 Verhaverbeke et al. .......... 239/436

FOREIGN PATENT DOCUMENTS

| JP | 7-50234 | 2/1995 |
| JP | 9-232279 | 9/1997 |
| JP | 11-111683 | 4/1999 |
| JP | 2000-68371 | 3/2000 |

* cited by examiner

*Primary Examiner*—Binh X Tran
(74) *Attorney, Agent, or Firm*—Sonnenschein Nath & Rosenthal LLP

(57) ABSTRACT

According to the present invention, a process for changing the form of a processed film is performed to planarize it before the processed film which is formed on a wafer is processed in a manufacturing process of a semiconductor device. As the process for changing the form of the processed film, there may be exemplified a single wafer type wet etching process. The compatibility of the processed film with processing means is taken into consideration and, for instance, the wet etching process is applied to the processed film so as to eliminate parts incompatible with the processing means, so that a distribution in-plane of the processed film is previously improved.

16 Claims, 11 Drawing Sheets

METHOD FOR MANUFACTURING SEMICONDUCTOR DEVICE

TECHNICAL FIELD

The present invention relates to a method for manufacturing a semiconductor device, and more particularly to a technology that the form of a processed film is previously adapted to an optimum form in accordance with the feature of a processing method.

BACKGROUND Of THE INVENTION

In recent years, the submicron feature and the formation of the multi-layers of devices or wirings have been advanced with the high integration of a semiconductor device. While the submicron patterns of wirings have been formed by a thin film forming technology and a lithography technology, it is essentially necessary, upon formation of the multi-layers, to planarize a surface for the purpose of forming the submicron patterns with good accuracy. For instance, the submicron feature of a gate electrode greatly depends on the performance of the exposure device of the lithography technology. However, as for the submicron feature of a device isolation area and the reduction of distance from the gate electrode, the planarization technology of a substrate according to a Shallow Trench Isolation (refer it to as to STI, hereinafter) technology as well as a lithography technology also attracts attention.

As for the device isolation technology of LSI, an LOCOS isolation technology by a thermal oxide film has been hitherto employed. In the LOCOS, since an $Si_3N_4$ film is used as a mask to thermally oxidize an Si substrate itself, there exist great advantages that a process is simple and problems due to the device stress of the oxide film are rarely generated and the quality of the produced oxide film is good. Therefore, also in an LSI process in which a technological innovation is ardently carried out, an improvement is continuously performed in to the LOCOS isolation technology and the improved LOCOS isolation technology has been continuously used. However, as the generation of 0.25 µm occupies the main current, the LOCOS begins to arise a limitation from the viewpoint of submicron feature.

More specifically explained, a device isolation pitch is undesirably widened more by the approach of, what is called a bird's peak than the width of an opening of the $Si_3N_4$ film as the mask due to the bird's peak in which an oxidation reaction is spread in a transverse direction upon thermal oxidation. In order to suppress the bird's peak, a method for deleting a pad oxide film located just below the $Si_3N_4$ film may be effectively used, however, stress on the Si substrate by the $Si_3N_4$ film inconveniently causes the defect of crystal to be generated.

As described above, when the LOCOS is viewed from all-round aspects, the bird's peak becomes fatal so that it must be said that the submicron feature of the LOCOS is very difficult. Thus, as the device isolation technology, the STI is paid attention to in place of the LOCOS. According to the STI, since trenches are etched to fill insulating materials therein, there exists less conversion difference from a design dimension, and accordingly, the STI is suitable for the submicron manufacturing in principle. Further, since a surface planarizing operation is carried out by any method as described below after the insulating materials are filled in the trenches, the STI is advantageous in view of flatness required for highly accurate lithography.

The above described planarization technology is employed not only for the device isolation, but also for planarizing insulating films between wiring layers. Therefore, under these circumstances, a semiconductor device of next generation may not be established without the planarization technology.

As described above, the planarization technology essentially needs to be applied to a device of new generation. However, in recent years, a CMP (chemical mechanical polishing) technology has been ordinarily employed. An example in which the CMP technology is applied to the device isolation technology is shown in FIG. 10.

FIG. 10 shows a state in which trenches 102 are formed on a silicon substrates 101 and a filled insulating film 104 is filled therein by a CVD method. An $Si_3N_4$ film 103 is used as a CMP stopper layer to polish the filled insulating film 104 by employing a polishing material including silica as a main component from the state shown in FIG. 10.

The filled insulating film 104 used in this case is ordinarily formed by the plasma CVD method. However, according to the feature of the plasma CVD method, the film thickness $t_2$ of the outer peripheral part of a wafer is apt to be inevitably larger than the film thickness $t_1$ of the central part of the wafer (see FIG. 10).

In case that the CMP polishing is carried out from this state, when CMP polishing conditions are set on the basis of the film thickness of the central part of the wafer, the filled insulating film 104 on the $Si_3N_4$ film serving as the CMP stopper layer will not be polished and remain in the peripheral part of the wafer as shown in FIG. 11.

While this state is maintained, when the $Si_3N_4$ film as the stopper layer is to be removed by a wet etching method using hot phosphoric acid or an isotropic chemical dry etching method in a next step, the filled insulating film 104 remaining in the peripheral part of the wafer becomes a mask so that the film cannot be clearly removed. As a result, a desired processed form cannot be obtained in the peripheral part of the wafer so that the semiconductor device is inferior in view of characteristics, which causes a yield to be deteriorated.

For avoiding the above described adverse influences, when the filled insulating film 104 on the $Si_3N_4$ film 103 in the outer peripheral part of the wafer is to be polished so that the filled insulating film 104 is not left, the filled insulating film 104 in the trench 102 at the central part of the wafer is excessively polished next time. Thus, as shown in FIG. 12, the thickness of the filled insulating film 104 in the trench 102 at the central part of the wafer is different from that in the outer peripheral part.

At this time, there is not generated a problem in removing the $Si_3N_4$ film 103 as the stopper layer in a next step, however, since the film thickness of the filled insulating film 104 in the trench 102 is different between that of the central part of the wafer and that of the outer peripheral part of the wafer, a device isolation feature is consequently different in the surface of the wafer. Therefore, the desired characteristics of the semiconductor device cannot be obtained to cause a yield to be deteriorated.

Under these circumstances, a CMP planarization technology in which the processed film irrespective of the thickness of the processed film in the wafer is examined, however, desired results cannot be presently obtained.

SUMMARY OF THE INVENTION

The present invention was proposed by taking the above-described actual conditions into consideration and it is an object to provide a method for manufacturing a semiconductor device which can eliminate unevenness in characteristics due to the thickness distribution of a processed film and a performance difference as a problem resulting therefrom.

The inventors of the present invention eagerly studied to achieve the above-described object, so that they found that, before the processed film is processed, the distribution in-plane of the thickness of the processed film is preferably previously improved.

The present invention was completed on the basis of this knowledge, it is an object to provide a method for a semiconductor device wherein a process for previously changing the form of a processed film is performed to planarize it before the processed film which is formed on a wafer is processed in a manufacturing process of the semiconductor device.

According to the present invention, the distribution in-plane of the processed film is previously improved by taking into consideration the compatibility of the processed film with processing means and applying, for instance, a wet etching process to the processed film so as to cancel a part incompatible therewith.

As described above, since only the part incompatible with the processing means is removed by the wet etching method, what is called "a film thickness correcting wet etching technology" may be applied, so that subsequent processing works can be uniformly carried out to eliminate unevenness in characteristics of a semiconductor device.

Still other objects of the present invention and the specific advantages obtained by the present invention will become more apparent from the description of embodiments described below.

DETAILED DESCRIPTION OF THE PRESENTLY PREFERRED EMBODIMENTS

Now, a method for manufacturing a semiconductor device to which the present invention is applied will be described in detail by referring to the accompanying drawings.

The method for manufacturing a semiconductor device according to the present invention is based on a fundamental conception that the profile of the thickness of a processed film is previously grasped, and, for instance, etchant chemical is discharged only to parts incompatible with processing means such as parts with large film thickness to etch them. A single wafer type wet etching method is most suitably employed for the above-described etching.

In order to etch only the above-described parts with the large film thickness, etchant is discharged to many points on the basis of, for instance, positional information in the radial direction of a wafer and film thickness profile information.

Figure 1:
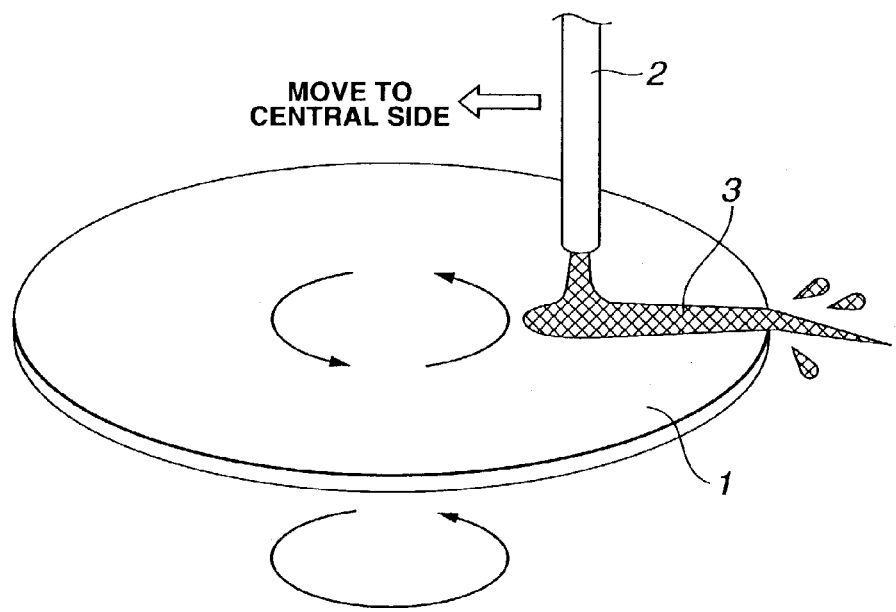
FIG. 1 is a schematic view showing one example of a discharging method for etchant chemical.

Specifically, as shown in FIG. 1, a wafer 1 is rotated. While a chemical nozzle 2 is moved from an outer peripheral side to a central side, etchant chemical 3 is discharged to etch a processed film on the wafer 1.

In the processed film which is formed on the wafer 1, the thickness of the outer peripheral side of the wafer 1 is ordinarily liable to be larger than that of the inner peripheral side.

As described above, when the etchant chemical is discharged from the chemical nozzle 2 while the wafer 1 is rotated, the chemical flows outward in accordance with a centrifugal force like, what is called a spin coater or the like.

Here, when the etchant chemical 3 is sequentially discharged while the chemical nozzle 2 is moved from the outer peripheral side to the central side, the outer peripheral side is exposed the more by the etchant chemical 3 for a long time. In other words, the processed film in the outer peripheral side is etched the more for a long time so that the amount of etching is increased. Thus, the difference in the thickness of the processed film between the outer peripheral side and the inner peripheral side is canceled.

At the time of the above-described wet etching process, as etchant chemical, a kind of chemical capable of etching a processed film in a lower etching rate is preferably employed. When an etching rate is too high, it is difficult to control the amount of etching, which undesirably leads to excessive etching.

Further, the discharge of the chemical at the specific position of the wafer is preferably set to a small flow rate, a short-time process and the rotating speed of the wafer under which the chemical does not flow to a central direction. When the etchant chemical flows to the inner peripheral side, this makes it difficult to eliminate the difference in film thickness.

As mentioned above, this technology is employed so that the thickness distribution of the processed film can be previously uniformly set. Thus, the above-described problems can be avoided by processing the film under, for instance, the CMP process.

By the way, when the etchant chemical is continuously discharged from the central direction of the wafer, the processed film may be possibly inevitably urged to be etched too much in an edge direction. In order to avoid this phenomenon, the temperature of the etchant chemical is controlled to high temperature, for instance, to 30° C. or higher, preferably to 40° C. to 60° C. so that the amount of etching is preferably suppressed in accordance with a cooling effect when the etchant chemical flows to a part in the periphery of the wafer.

Figure 2:
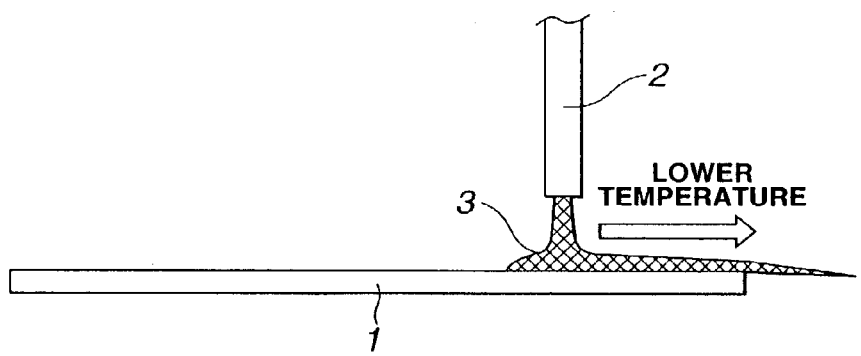
FIG. 2 is a schematic view showing another example of a discharging method for etchant chemical.

When the temperature of the etchant chemical is higher, the etching rate is the higher. As shown in FIG. 2, when the high temperature etchant chemical 3 is discharged from the chemical nozzle 2, the etching rate is high in the vicinity of the discharge position. Then, as the etchant chemical flows to the outer peripheral side, the temperature of the etchant chemical 3 is gradually lowered so that an etching rate is also gradually lowered. Thus, the etching rate is greatly lowered in the outer peripheral edge of the wafer 1. Accordingly, the excessive etching of the processed film is prevented in the edge of the wafer 1.

When the above-described method is employed, a function for lowering the temperature of the peripheral part of the wafer 1 is more effectively utilized in order to urge the etchant chemical to be cooled. As a mechanism for applying the function for lowering the temperature, for instance, there may be exemplified a measure for discharging $N_2$ only to the back surface of the peripheral part of the wafer 1 to cool it.

The addition of this technique makes it possible to previously obtain an ideal thickness distribution of the processed film. Then, the film is processed by the CMP process or the like so that the above-described problem can be avoided.

The above-described high temperature etchant chemical is put to practical use so as to meet, for instance, a case in which the thickness of the processed film in the inner peripheral side of the wafer 1 is larger than that in the outer peripheral side.

As described before, when the high temperature etchant chemical is discharged, the etching rate in the vicinity of a chemical discharge position is higher than the etching rate in a position separate therefrom.

Therefore, in case that the thickness of the processed film in the inner peripheral side of the wafer 1 is larger than that in the outer peripheral side, when the high temperature etchant chemical is discharged to the inner peripheral position in which the thickness of the processed film is larger, the inner peripheral side is etched in a higher etching rate and the outer peripheral side is etched in a lower etching rate. As a result, the amount of etching in the inner peripheral side is larger than that in the outer peripheral side to correct the film thickness difference.

The present invention can be also applied to, for instance, an insulating film planarizing CMP between wiring layers, a metallic film filling CMP, etc. as well as the CMP technology of the device isolation. Further, the present invention may be applied to an etching back method as a planarization technology except the CMP, an ITO film or a spread film or the like. In addition, the present invention can be applied to the improvement of in-plane unevenness in a dry etching process.

EXAMPLES

Now, specific examples of a method for manufacturing a semiconductor device to which the present invention is applied will be described in accordance with experimental results.

Example 1

Figure 3:
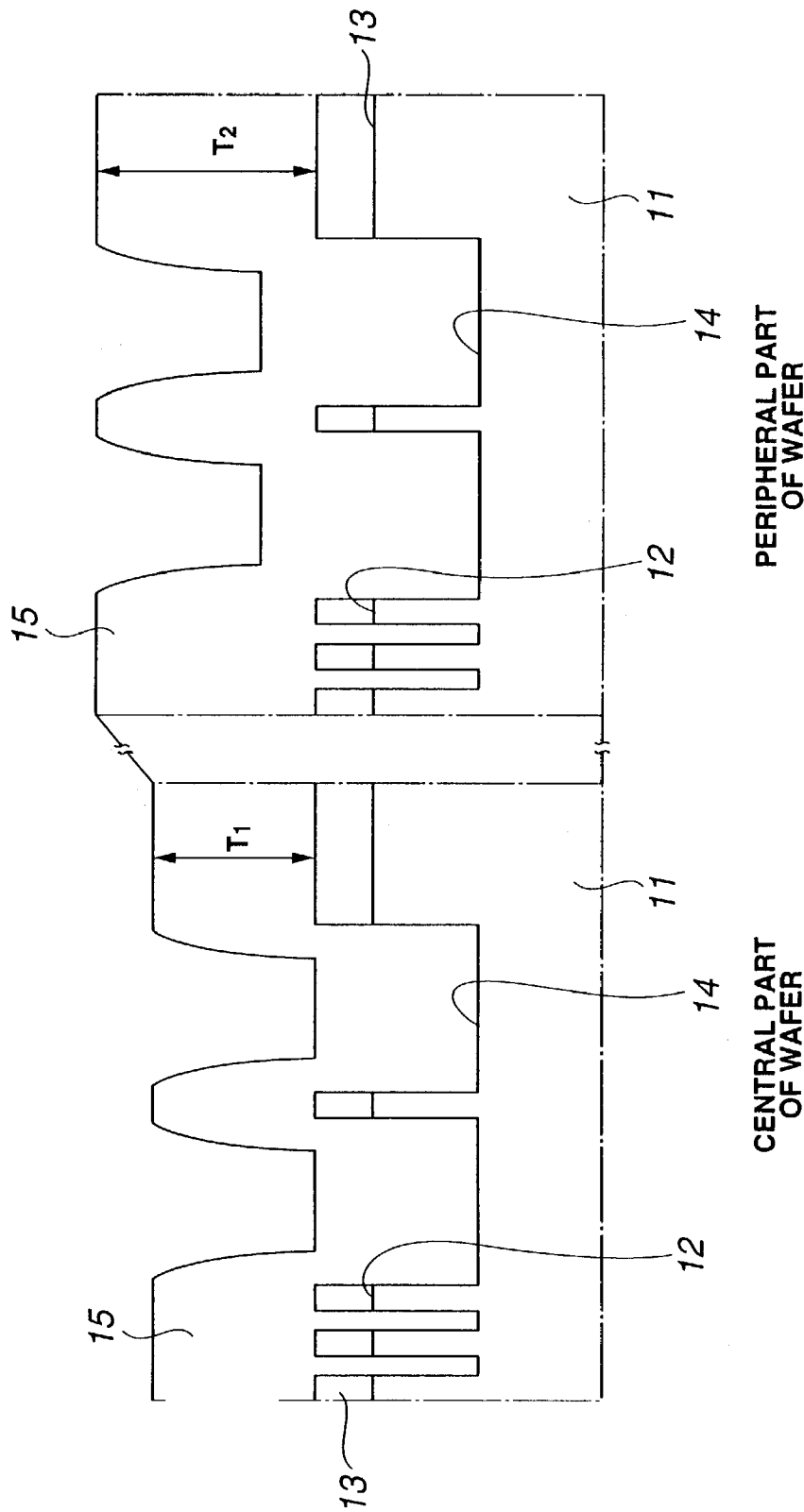
FIG. 3 is a schematic view showing a state in which a filled oxide film is formed.

A sample used in this example has a structure shown in FIG. 3. On a silicon substrate 11, a thermal oxide film 12 of the thickness of about 5 to 20 nm and a silicon nitride film as a CMP stopper film 13 of the thickness of about 50 to 250 nm were previously formed in accordance with a pressure reducing CVD method, then, a photoresist was patterned by a KrF excimer stepper to form trenches 14 with the depth of 450 nm. A silicon oxide film 15 was accumulated thereon as a filled film by a CVD method.

Figure 4:
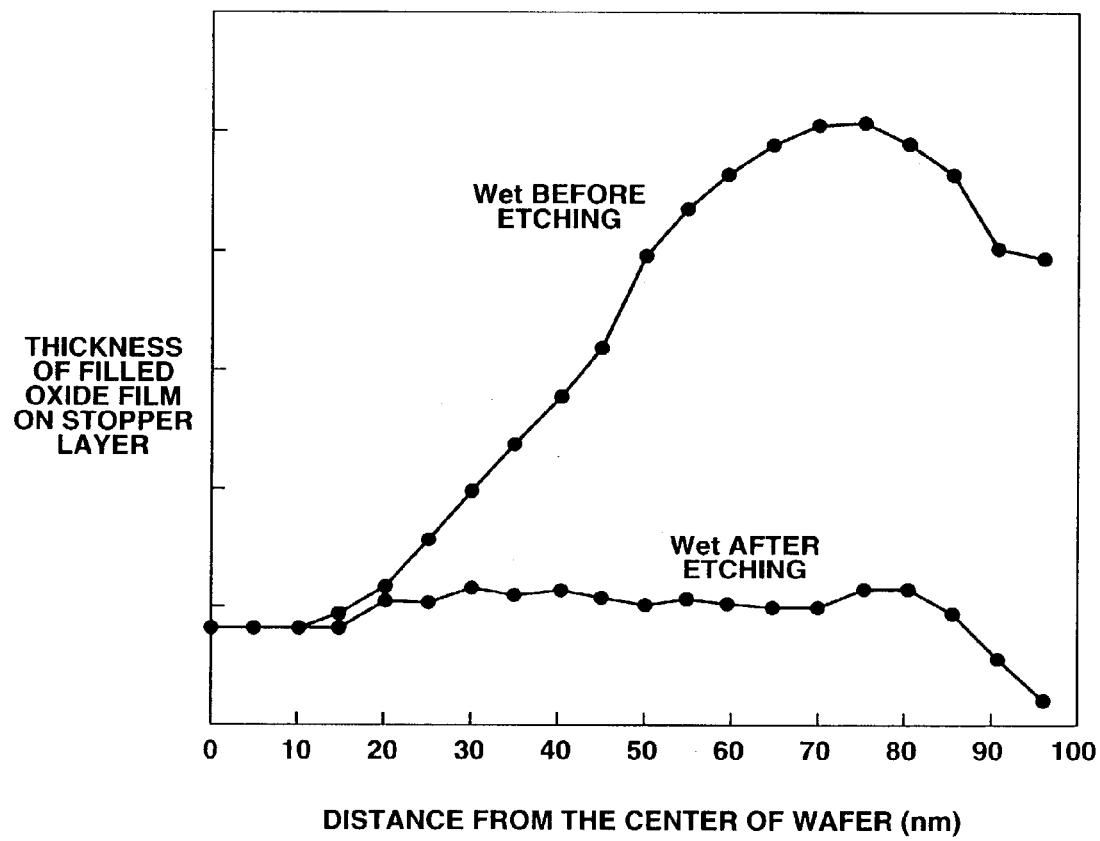
FIG. 4 is a characteristic view showing the profiles of the thickness of the filled oxide film.

At this time, the thickness of the filled oxide film 15 on the stopper film 13 was measured in the radial direction of a wafer to obtain a profile before a wet etching process as shown in FIG. 4. As understood from the figure, there exists a large film thickness difference between the film thickness $T_1$ of the central part of the wafer and the film thickness $T_2$ of an outer peripheral part.

In order to cancel the thickness of the outer peripheral part for the above-described profile, a single wafer type wet etching process was applied to the wafer. In the present example, the structure shown in FIG. 3 was processed under conditions described below. 1) As chemical which can wet-etch the filled oxide film 15 as the processed film, dilute hydrofluoric acid (DHF) is employed, 2) In order to suppress etching in an outermost peripheral part, the temperature of the chemical is set to high temperature (about 50° C.) and $N_2$ is discharged from the back side of the wafer to enhance the cooling effect of the substrate, 3) A nozzle for discharging the chemical from the position 80 mm spaced from a center to 30 mm inward in the steps of 5 mm is moved as shown in FIGS. 1 and 4) One step of atomization of the chemical is carried out for 2 to 4 seconds and the flow rate of discharge is set to low flow rate as low as 1 liter/minute or less.

Figure 5:
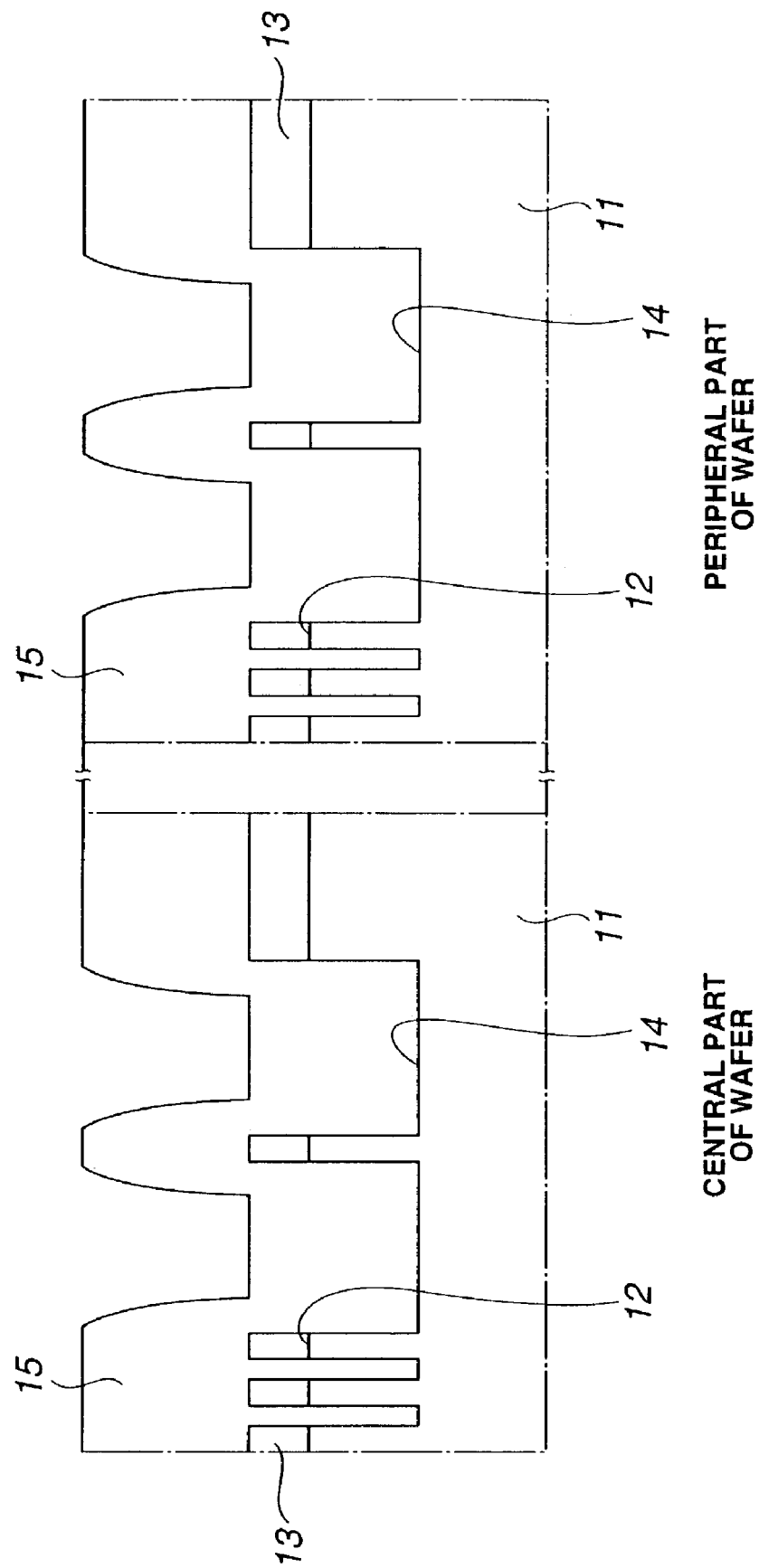
FIG. 5 is a schematic view showing the state of a filled oxide film after a wet etching process.

The thickness of the filled oxide film 15 on the stopper film 13 obtained after the above-described process was carried out was measured in the radial direction of the wafer to have a profile after the wet etching process as shown in FIG. 4. As understood from FIG. 4, the thickness of the filled oxide film 15 in the outer peripheral part is reduced and the substantially same thickness is obtained from the center to the outer peripheral side (see FIG. 5).

Figure 6:
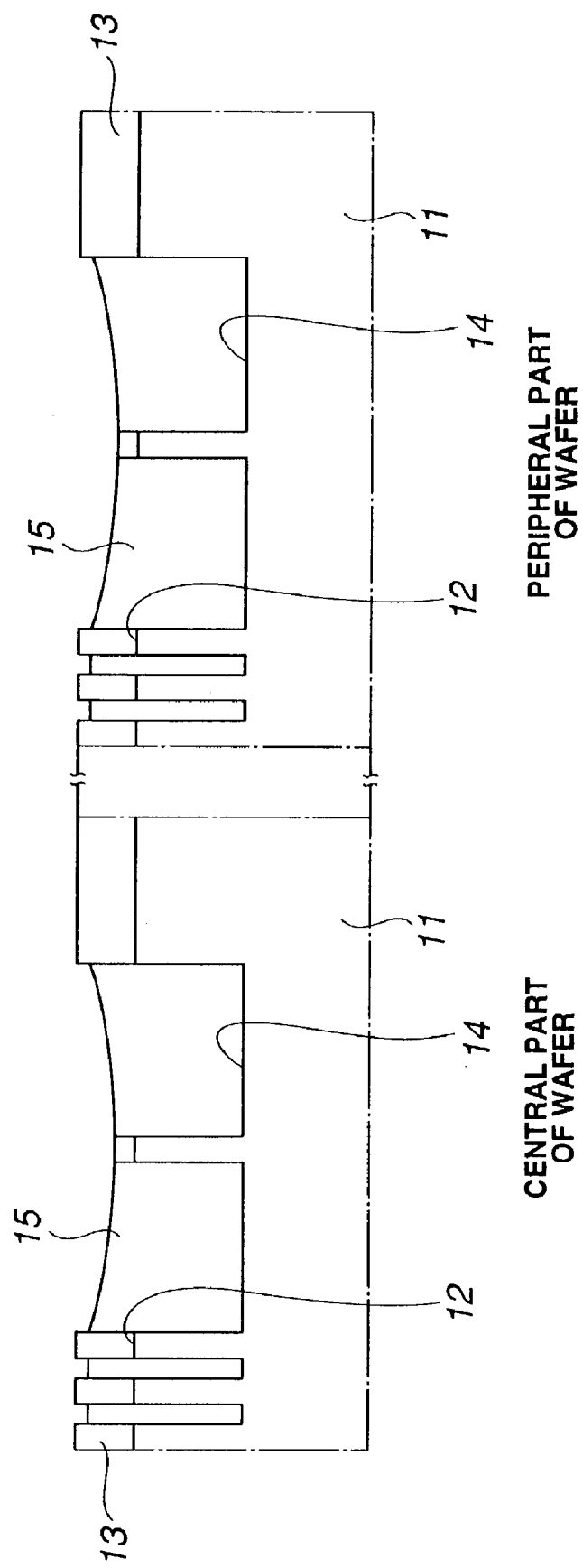
FIG. 6 is a schematic view showing the state of the filled oxide film after a CMP process.

All the filled film 15 located on the stopper layer 13 is polished in accordance with the CMP technology and removed from this state. Since there is no difference in form between the central part and the outer peripheral part of the wafer, the device isolation structures of the completely same form can be achieved in all the plane of the wafer, as shown in FIG. 6.

Example 2

Figure 7:
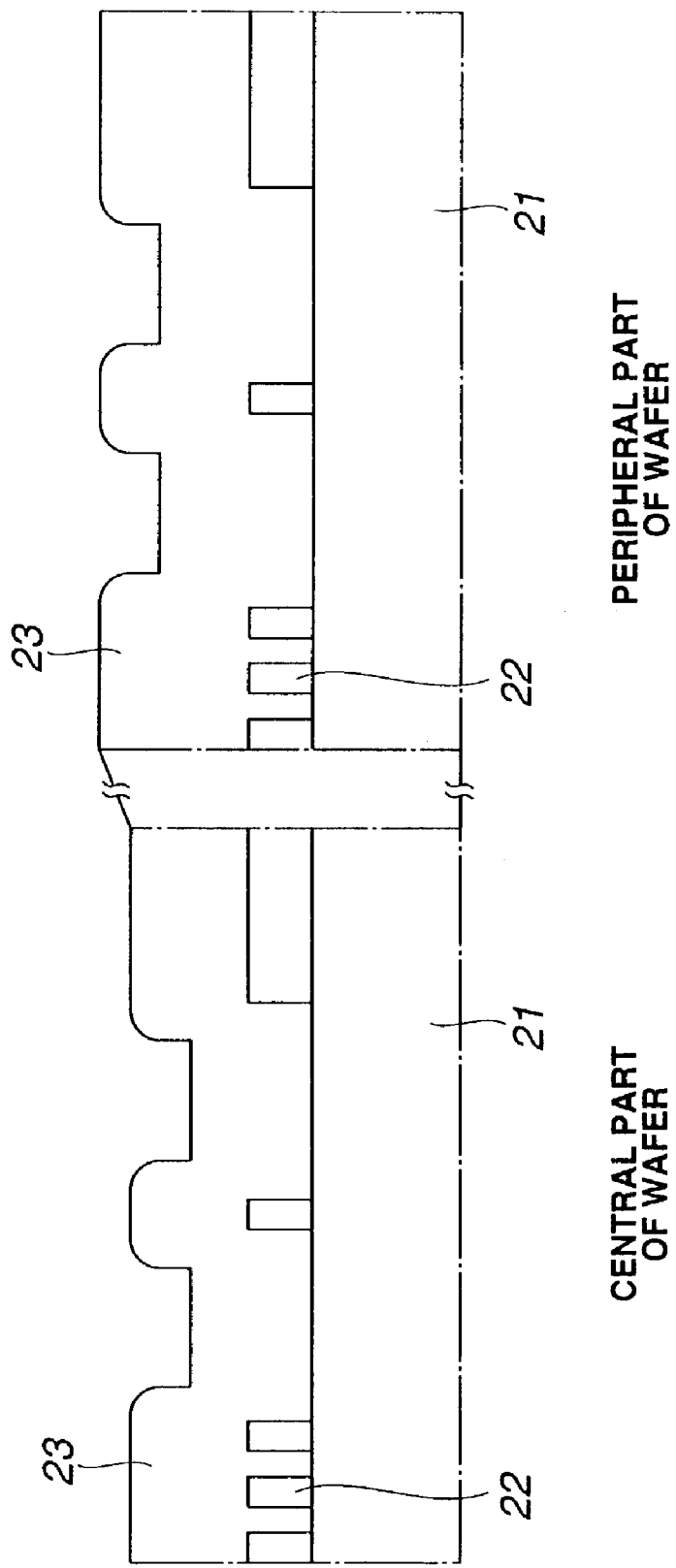
FIG. 7 is a schematic view showing a state in which an interlayer insulating film is formed.

A sample used in this example has a structure shown in FIG. 7. In this sample, a metallic wiring film is formed on an oxide film 21 in which a semiconductor is formed, and further, the film is processed and patterned in accordance with a lithography technique and a reactive ion etching (RIE) technique to form metallic wirings 22. Then, an interlayer insulating film 23 between the wiring layers is formed by the CVD method. When a plasma CVD method is used for the CVD method, the form in the plane of a wafer is formed so that the thickness of the film in a central part is different from that in a peripheral part. Thus, the sectional structure in the plane of the wafer is different as shown in FIG. 7.

In order to cancel the thickness of the outer peripheral part for the above described form, a single wafer type wet etching process is applied to the wafer. In this example, the structure shown in FIG. 7 was processed under conditions described below. 1) As chemical which can wet-etch the interlayer insulating film 23 as the processed film, dilute hydrofluoric acid (DHF) is employed, 2) In order to suppress etching in an outermost peripheral part, the temperature of the chemical is set to high temperature (about 50° C.) and $N_2$ is discharged from the back side of the wafer to enhance the cooling effect of the substrate, 3) A nozzle for discharging the chemical from the position 80 mm spaced from a center to 30 mm inward in the steps of 5 mm is moved as shown in FIGS. 1 and 4) One step of atomization of the chemical is carried out for 2 to 4 seconds and the flow rate of discharge is set to low flow rate as low as 1 liter/minute or less.

Figure 8:
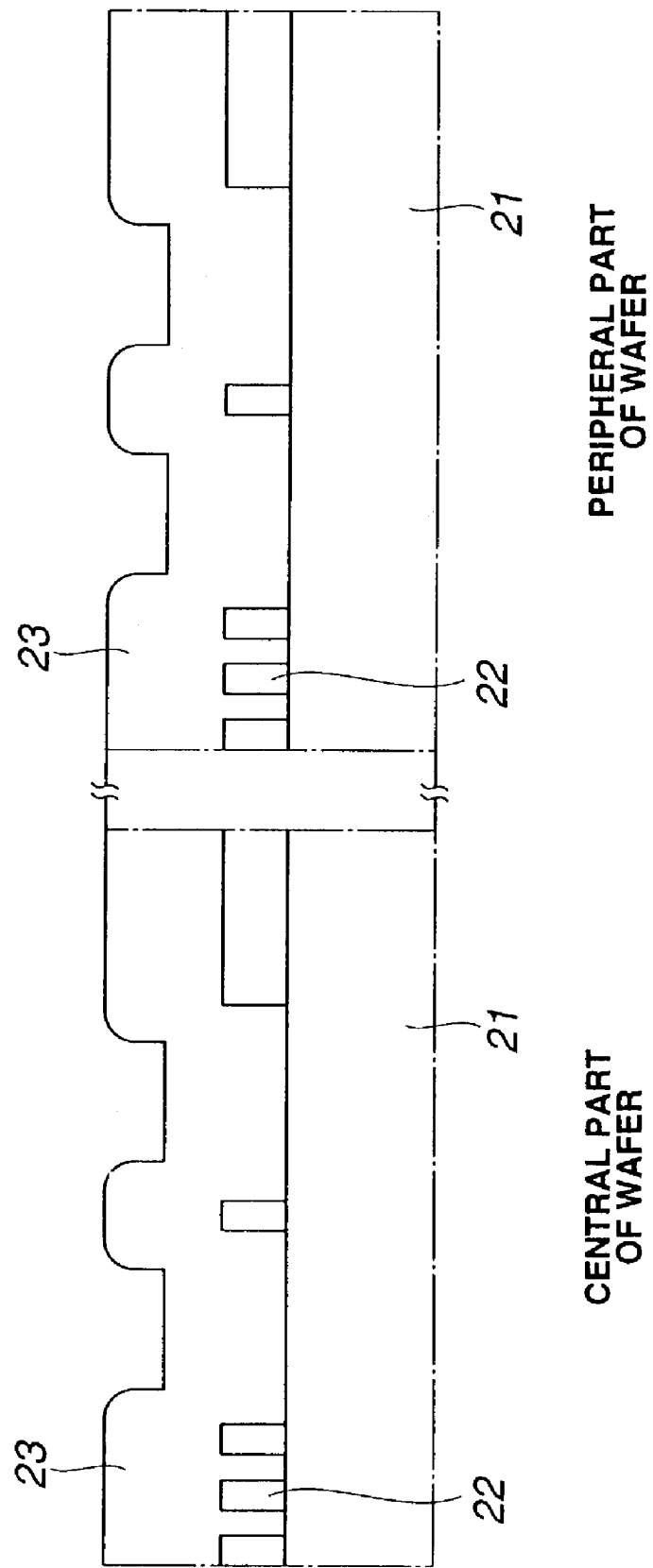
FIG. 8 is a schematic view showing the state of the interlayer insulating layer after the wet etching process.

The form of the interlayer insulating film 23 obtained after the above-described process is performed is shown in FIG. 8. The form of the central part of the wafer is substantially the same as that of the outer peripheral part. As apparent from the figure, the thickness of the interlayer insulating film 23 is reduced to have the substantially equal thickness from the center to the outer periphery.

Figure 9:
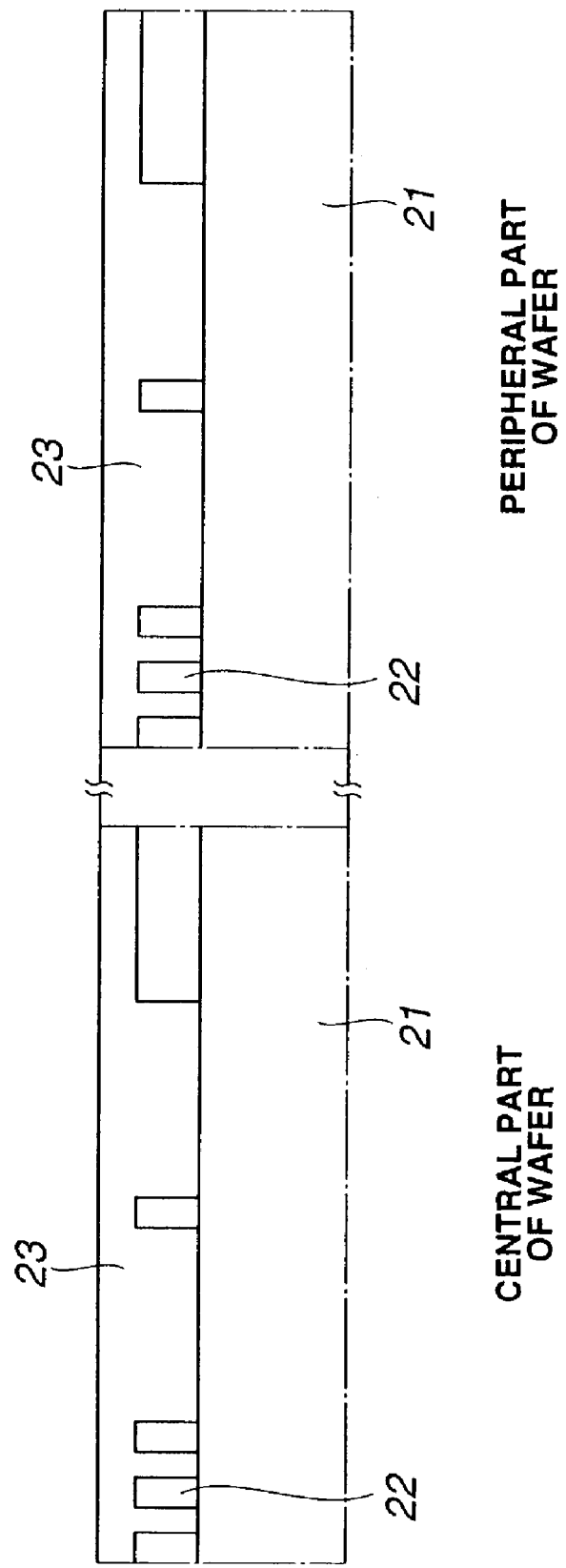
FIG. 9 is a schematic view showing the state of the interlayer insulating film after the CMP process.
Figure 10:
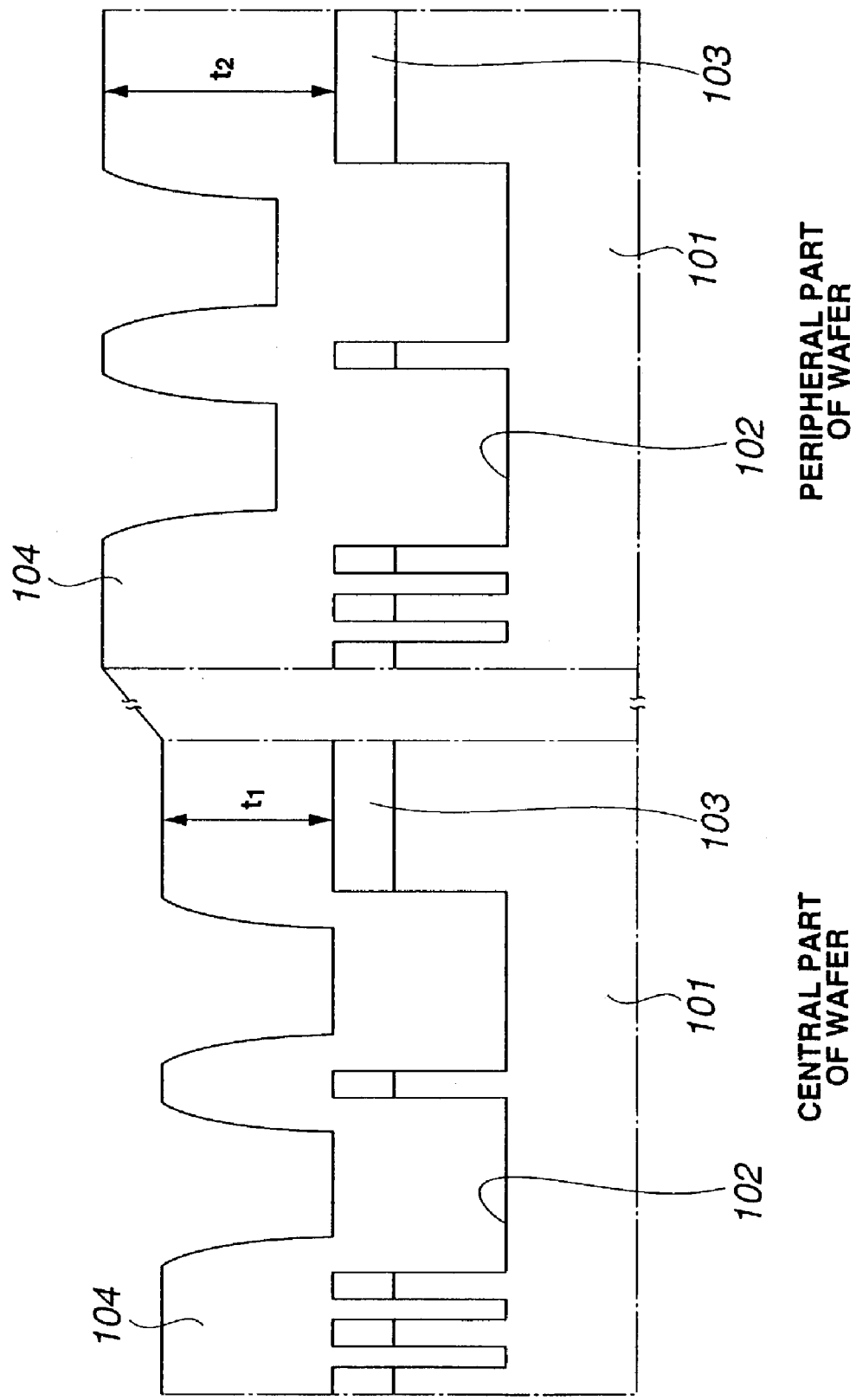
FIG. 10 is a schematic view showing a state in which a filled oxide film is formed.
Figure 11:
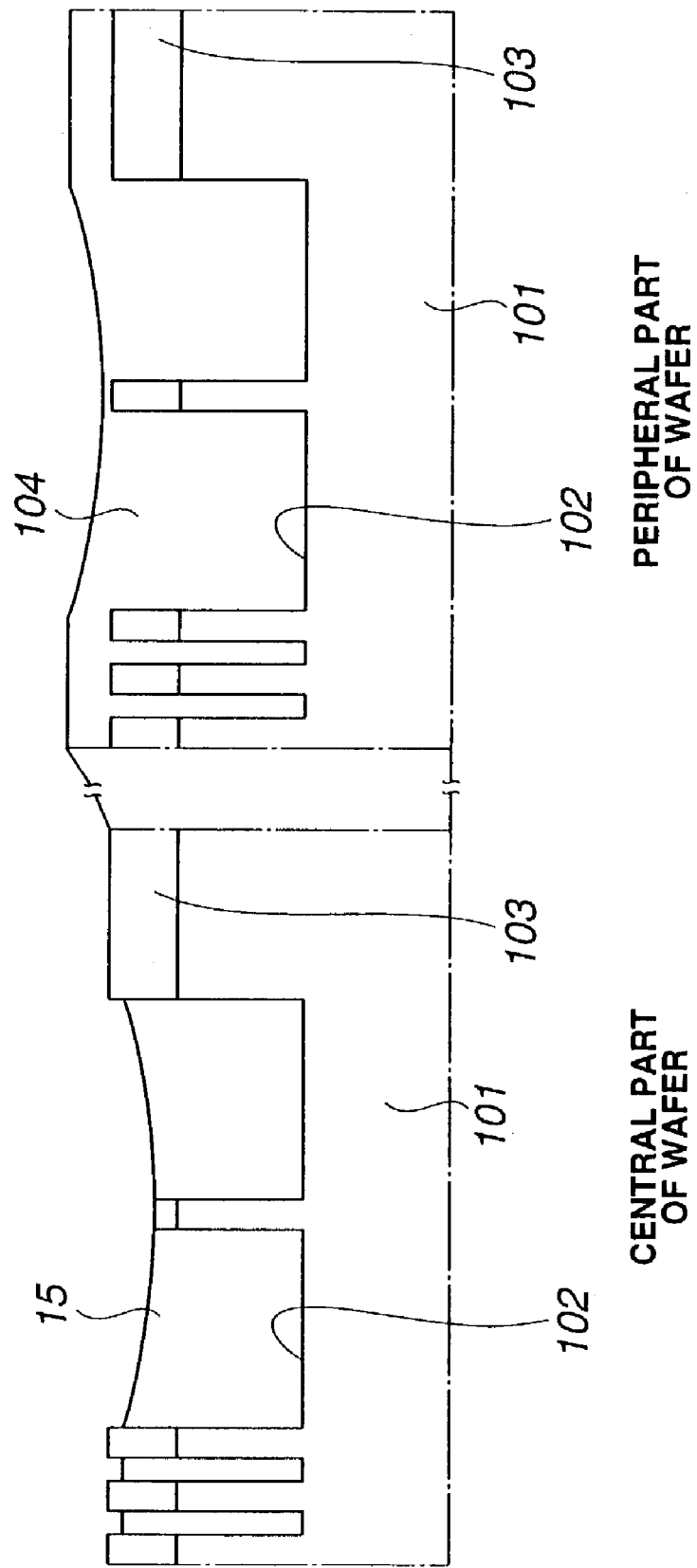
FIG. 11 is a schematic view showing the state of the filled oxide film after the CMP process when the CMP polishing conditions are set to meet the central part of the wafer.
Figure 12:
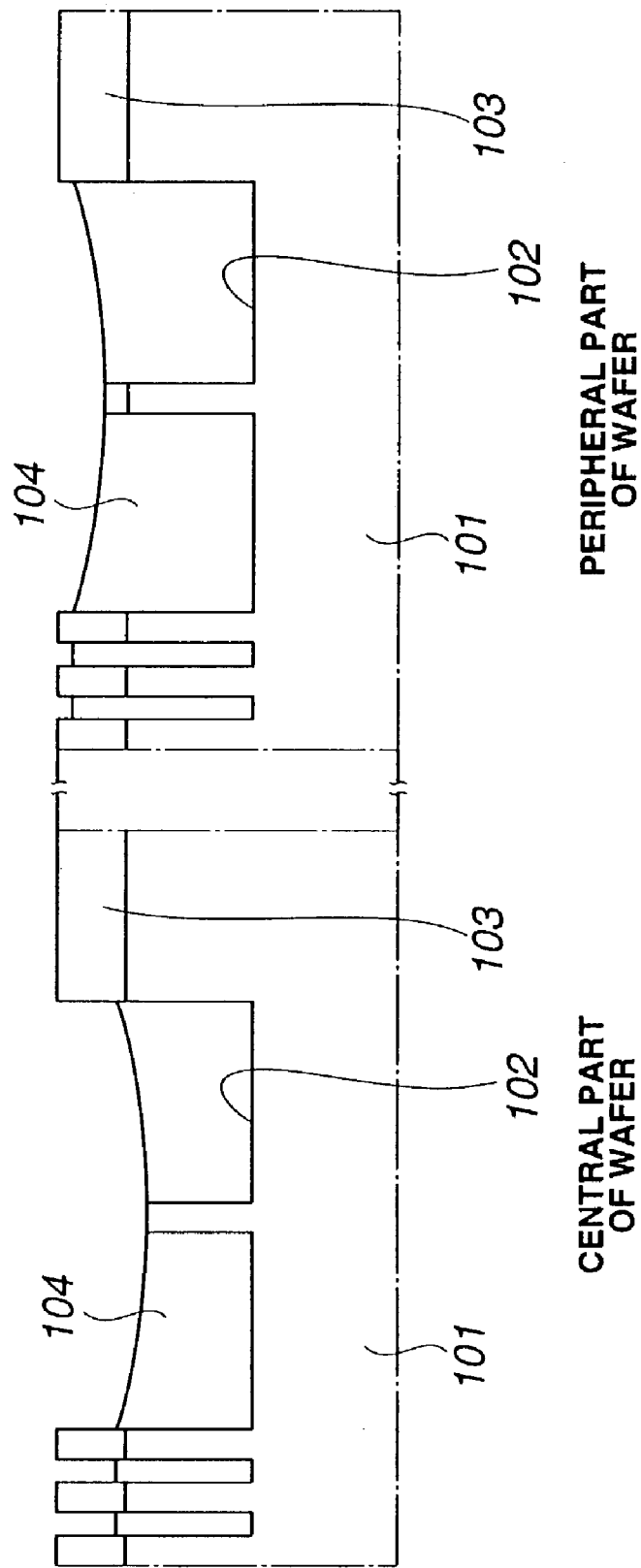
FIG. 12 is a schematic view showing the state of the filled oxide film after the CMP process when the CMP polishing conditions are set to meet the peripheral part of the wafer.

On the other hand, a result obtained by planarizing the interlayer insulating film 23 using the CMP technique or using the etching back method by RIE technique is shown in FIG. 9. As understood from FIG. 9, there is not present a difference in form between the central part and the outer peripheral part of the wafer so that structures between wiring layers having the same form can be achieved in all parts in the plane of the wafer.

In the above-described examples, although there is disclosed examples in which the process for previously changing the form of the processed film is applied to the processed film which is formed on the wafer, for instance, the filled silicon oxide film to planarize it before a processing work, the processed film may be the wafer itself. For example, when the thickness of the central part of the wafer is different from that of the outer peripheral part thereof, the wafer may be planarized by using the method of the present invention.

INDUSTRIAL APPLICABILITY

As described above, according to the present invention, since the in-plane distribution of the processed film is previously improved so as to meet the characteristics of the processing method, before the processing of the processed film, for instance, the chemical mechanical polishing (CMP) method or the reactive ion dry etching (RIE) method is carried out, the performance difference such as the unevenness in characteristics of the semiconductor device can be canceled, which can contribute to the improvement of yield or the like.

The invention claimed is:

1. A method for manufacturing a semiconductor device, comprising:
    using a chemical deposition technique, forming a processed film on a front side of a wafer having a trench pattern, the processed film being deposited such that a first portion of the processed film formed on a central portion of the wafer has a different thickness than a second portion of the processed film formed on an outer peripheral portion of the wafer;
    wet-etching the processed film on the wafer, wherein the step of wet-etching includes rotating the wafer and discharging a controlled amount of etchant at a high temperature on a thicker one of the first portion or the second portion of the processed film formed on the wafer; and
    while wet-etching, discharging a cooling gas onto a backside of the outer peripheral portion of the wafer to lower the temperature of the wafer in proximity to the outer peripheral portion of the wafer to control the etching of the processed film such that a remaining portion of the processed film has a uniform thickness.

2. The method for manufacturing a semiconductor device according to claim 1, wherein the processed film is etched using a single wafer type wet etching process.

3. The method for manufacturing a semiconductor device according to claim 1, wherein the processed film is a silicon oxide film.

4. The method for manufacturing a semiconductor device according to claim 1, further comprising lowering the temperature of the etchant gradually on the wafer.

5. The method for manufacturing a semiconductor device according to claim 1, wherein the etchant is a hydrofluoric acid.

6. The method for manufacturing a semiconductor device according to claim 1, further comprising atomizing the etchant for 2 to 4 seconds.

7. The method for manufacturing a semiconductor device according to claim 1, wherein the etchant is discharged at a rate of 1 liter/minute or less.

8. The method of manufacturing a semiconductor device according to claim 1, wherein the cooling gas is $N_2$ that is discharged onto a back surface of the wafer.

9. The method of manufacturing a semiconductor device according to claim 1, wherein the high temperature is within the range from 40° C. to 60° C.

10. The method of manufacturing a semiconductor device according to claim 1, wherein a nozzle discharging the etchant is moved from the outer peripheral portion of the wafer, on which the thicker one of the first portion or the second portion of the processed film is formed, to the central portion of the wafer.

11. A method for manufacturing a semiconductor device comprising:
    using a chemical deposition technique, forming a processed film on a front side of a wafer having a trench pattern, the processed film being deposited such that a first portion of the processed film formed on a central portion of the wafer has a different thickness than a second portion of the processed film formed on an outer peripheral portion of the wafer;
    wet-etching the processed film on the wafer, wherein the step of wet-etching includes rotating the wafer and discharging an etchant at a high temperature on a thicker one of the first portion or the second portion of the processed film formed on the wafer while the wafer is rotating;
    gradually lowering the temperature of the etchant on the wafer;
    while wet-etching, discharging $N_2$ onto a backside of the outer peripheral portion of the wafer to lower the temperature of the wafer in proximity to the outer peripheral portion of the wafer to control the etching of the processed film such that a remaining portion of the processed film has a uniform thickness; and
    atomizing the etchant for 2 to 4 seconds.

12. The method of manufacturing a semiconductor device according to claim 11, wherein the processed film is etched using a single wafer type wet etching process.

13. The method of manufacturing a semiconductor device according to claim 11, wherein the processed film is a silicon oxide film.

14. The method of manufacturing a semiconductor device according to claim 11, wherein the etchant is a hydrofluoric acid.

15. The method of manufacturing a semiconductor device according to claim 11, wherein the etchant is discharged at a rate of 1 liter/minute or less.

16. The method of manufacturing a semiconductor device according to claim 11, wherein the high temperature is within the range from 40° C. to 60° C.

* * * * *

UNITED STATES PATENT AND TRADEMARK OFFICE
CERTIFICATE OF CORRECTION

| | |
|---|---|
| PATENT NO. | : 7,541,293 B2 |
| APPLICATION NO. | : 10/168444 |
| DATED | : June 2, 2009 |
| INVENTOR(S) | : Hayato Iwamoto and Kei Kinoshita |

It is certified that error appears in the above-identified patent and that said Letters Patent is hereby corrected as shown below:

ON THE FACE PAGE - INSERT ITEM (30) TO READ

--(30) Foreign Application Priority Data

Oct. 25, 2000 (JP)          2000-326063--.

Signed and Sealed this

Eighteenth Day of August, 2009

David J. Kappos
*Director of the United States Patent and Trademark Office*